US011398257B2

(12) United States Patent
Mori et al.

(10) Patent No.: US 11,398,257 B2
(45) Date of Patent: Jul. 26, 2022

(54) HEADER LAYOUT DESIGN INCLUDING BACKSIDE POWER RAIL

(71) Applicant: Taiwan Semiconductor Manufacturing Company, Ltd., Hsinchu (TW)

(72) Inventors: Haruki Mori, Hsinchu (TW); Chien-Chi Tien, Hsinchu (TW); Chia-En Huang, Hsinchu (TW); Hidehiro Fujiwara, Hsinchu (TW); Yen-Huei Chen, Hsinchu (TW); Feng-Lun Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/085,067

(22) Filed: Oct. 30, 2020

(65) Prior Publication Data

US 2021/0201961 A1    Jul. 1, 2021

Related U.S. Application Data

(60) Provisional application No. 62/954,914, filed on Dec. 30, 2019.

(51) Int. Cl.
| G11C 5/14 | (2006.01) |
| G11C 5/06 | (2006.01) |
| H01L 23/528 | (2006.01) |
| H01L 23/50 | (2006.01) |

(52) U.S. Cl.
CPC ............... *G11C 5/14* (2013.01); *G11C 5/06* (2013.01); *H01L 23/50* (2013.01); *H01L 23/5286* (2013.01)

(58) Field of Classification Search
CPC .. G11C 5/14; G11C 5/06; H01L 23/50; H01L 23/5286
USPC ........................................................... 365/226
See application file for complete search history.

(56) References Cited

U.S. PATENT DOCUMENTS

| 2016/0275227 A1 | 9/2016 | Liu et al. |
| 2018/0315699 A1 | 11/2018 | Lai et al. |
| 2019/0164882 A1 | 5/2019 | Chen et al. |
| 2020/0019666 A1* | 1/2020 | Lai .................... G06F 30/367 |
| 2021/0143127 A1* | 5/2021 | Jain .................... H01L 25/50 |

* cited by examiner

*Primary Examiner* — Huan Hoang
(74) *Attorney, Agent, or Firm* — Merchant & Gould P.C.

(57) ABSTRACT

Header circuitry for a memory device includes multiple backside power rails that form distinct voltage sources for a plurality of switching devices in the header circuitry. The header circuitry includes at least one region of a first conductivity type. A first section in the first region includes one backside power rail (BPR) that forms a first voltage source that provides a first voltage. A second section in the same first region includes another BPR that forms a second voltage source that provides a second voltage that is different from the first voltage.

20 Claims, 15 Drawing Sheets

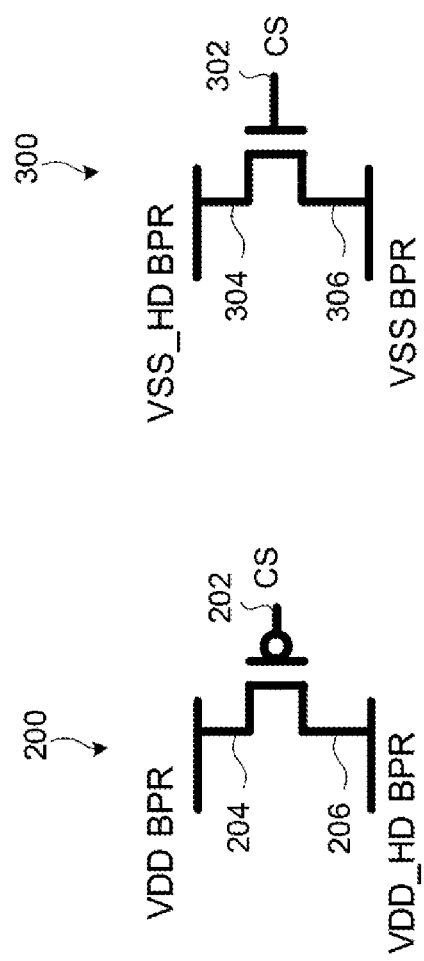

HEADER LAYOUT DESIGN INCLUDING BACKSIDE POWER RAIL

CROSS-REFERENCE TO RELATED APPLICATION(S)

This application claims priority to U.S. Provisional Application No. 62/954,914 entitled "Header Layout Design Including Backside Power Rail" filed on Dec. 30, 2019, of which the entire disclosure is hereby incorporated by reference in its entirety.

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated circuit (IC) chips may comprise millions or billions of semiconductor devices arranged on a single semiconductor die.

BRIEF DESCRIPTION OF THE DRAWINGS

Aspects of the present disclosure are best understood by the following detailed description in conjunction with the accompanying drawings, where like reference numerals designate like structural elements. It is noted that various features in the drawings are not drawn to scale. In fact, the dimensions of the various features may be arbitrarily increased or reduced for clarity of discussion.

FIG. 2 illustrates a first switching device that is suitable for use in the header circuitry shown in FIG. 1 in accordance with some embodiments;

FIG. 3 depicts a second switching device that is suitable for use in the header circuitry shown in FIG. 1 in accordance with some embodiments;

DETAILED DESCRIPTION

Figure 1:
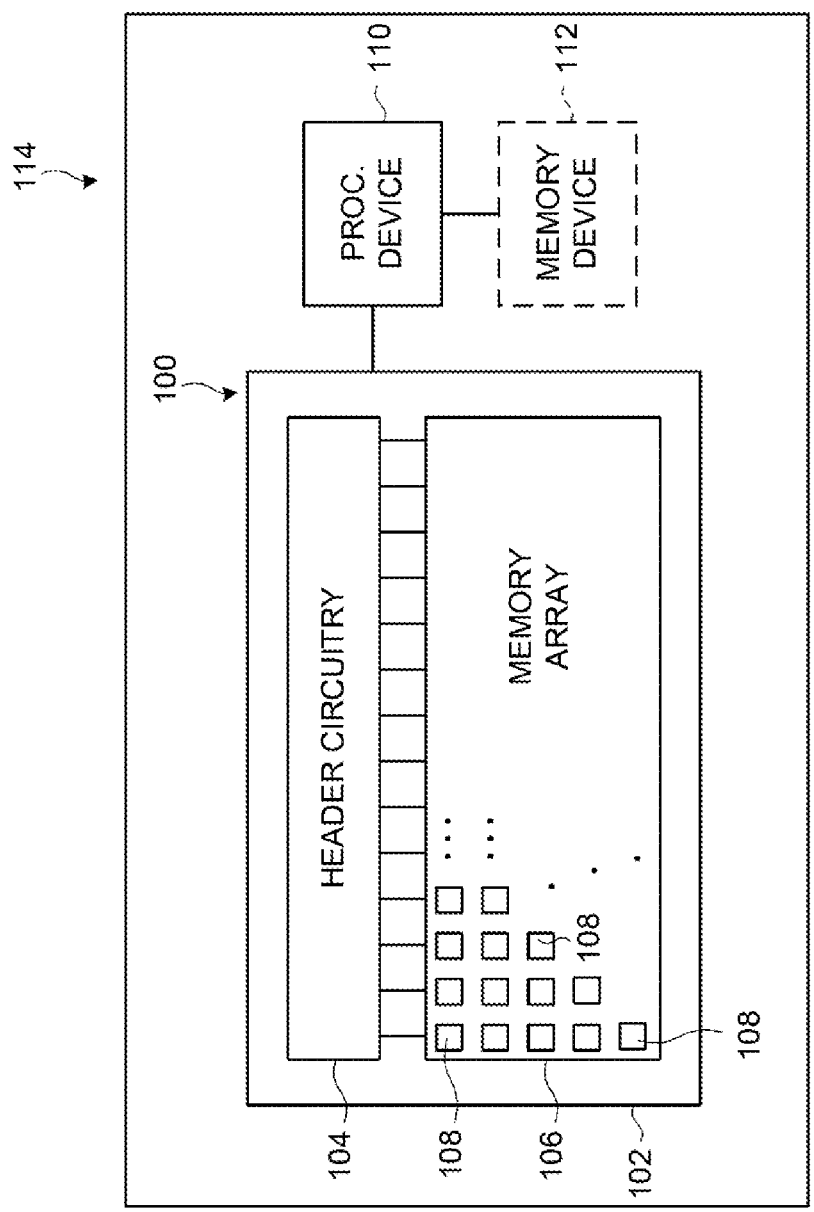
FIG. 1 depicts an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Semiconductor devices, such as memory devices, are commonly used in various integrated circuits. Embodiments disclosed herein provide header layout designs for semiconductor devices that include one or more backside power rails (BPR). Although embodiments are described in conjunction with a memory device, other embodiments are not limited to a memory device. Embodiments can include any semiconductor device, integrated circuit, or electronic device that has one or more portions powered selectively using switches operably connected to different voltage sources.

In memory devices, a memory array includes memory cells that store information. Header circuitry is operably connected to the memory array and used to turn on and turn off some or all of the memory cells. Embodiments disclosed herein include both p-type transistors and n-type transistors that are used as switches in the header circuitry. The p-type transistors and the n-type transistors are operably connected to respective backside power rails. In a non-limiting example, the p-type and the n-type transistors are formed in two rows with one row including one type of transistor (e.g., p or n type transistor) and the other row including both types of transistors (p and n type transistors).

These and other embodiments are discussed below with reference to FIGS. 1-16. However, those skilled in the art will readily appreciate that the detailed description given herein with respect to these Figures is for explanatory purposes only and should not be construed as limiting.

FIG. 1 depicts an example memory device in accordance with some embodiments. The memory device 100 can be any suitable memory device, such as, for example, a static random access memory (SRAM) device. In the illustrated embodiment, the memory device 100 is implemented on a substrate 102 and includes header circuitry 104 operably connected to a memory array 106.

The memory array 106 includes memory cells 108 that are typically constructed in rows and columns, although other embodiments are not limited to this arrangement. Each memory cell 108 includes multiple transistors (e.g., six) connected between a first voltage source (e.g., VDD) and a second voltage source (e.g., VSS or ground) such that one of two storage nodes can be occupied by the information to be stored, with the complementary information stored at the other storage node. Various techniques may be employed to reduce the power consumption of the memory array 106. For example, portions of the memory array 106 may be turned off during a sleep mode or a shutdown mode. The header circuitry 104 includes switching devices that are used to turn on and turn off the entire memory array 106 or portions of the memory array 106. Any suitable switching devices can be used. Non-limiting example switching devices are shown in FIGS. 2, 3, 9, 11, 13, and 15.

A processing device 110 is operably connected to the memory device 100. Example processing devices include, but are not limited to, a central processing unit, a microprocessor, an application specific integrated circuit, a graphics processing unit, a field programmable gate array, or combinations thereof. In one embodiment, the memory array 106 stores instructions, that when executed by the processing device 110, control one or more operations of the memory device 100. Additionally or alternatively, a separate memory device 112 is operably connected to the processing device 110. The separate memory device 112 stores instructions, that when executed by the processing device 110, control one or more operations of the memory device 100. For example, the processing device 110 is configured to control the switching devices in the header circuitry 104.

The memory device 100, the processing device 110, and if included, the memory device 112 are included in an electronic device 114. The electronic device 114 can be any suitable electronic device. Example electronic devices include, but are not limited to, a computing device such as a laptop computer and a tablet, a cellular telephone, a television, an automobile, a stereo system, and a camera.

FIG. 2 illustrates a first switching device that is suitable for use in the header circuitry shown in FIG. 1 in accordance with some embodiments. The representative first switching device 200 is a p-type transistor, such as a p-type metal oxide semiconductor (PMOS) transistor. The gate electrode 202 of the first switching device 200 is connected to a control signal (CS) that is used to turn on and turn off the first switching device 200. A first node 204 (e.g., a source node) is operably connected to a first voltage source (e.g., VDD BPR) of a first backside power rail (BPR) and a second node 206 (e.g., a drain node) is operably connected to a second voltage source (e.g., VDD_HD BPR) of a second BPR. As will be described in more detail later, the backside power rails are disposed at the backside of the memory device and the layout design for the header circuitry provides connections to the backside power rails on both the source and the drain sides of the switching device 200.

FIG. 3 depicts a second switching device that is suitable for use in the header circuitry shown in FIG. 1 in accordance with some embodiments. The representative second switching device 300 is an n-type transistor, such as an n-type metal oxide semiconductor (NMOS) transistor. Like the first switching device 200 shown in FIG. 2, the gate electrode 302 of the second switching device 300 is connected to a control signal (CS) that is used to turn on and turn off the second switching device 300. A first node 304 (e.g., a drain node) is operably connected to a first voltage source (e.g., VSS_HD BPR) of a first backside power rail (BPR) and a second node 306 (e.g., a source node) is operably connected to a second voltage source (e.g., VSS BPR) of a second BPR.

Figure 4:
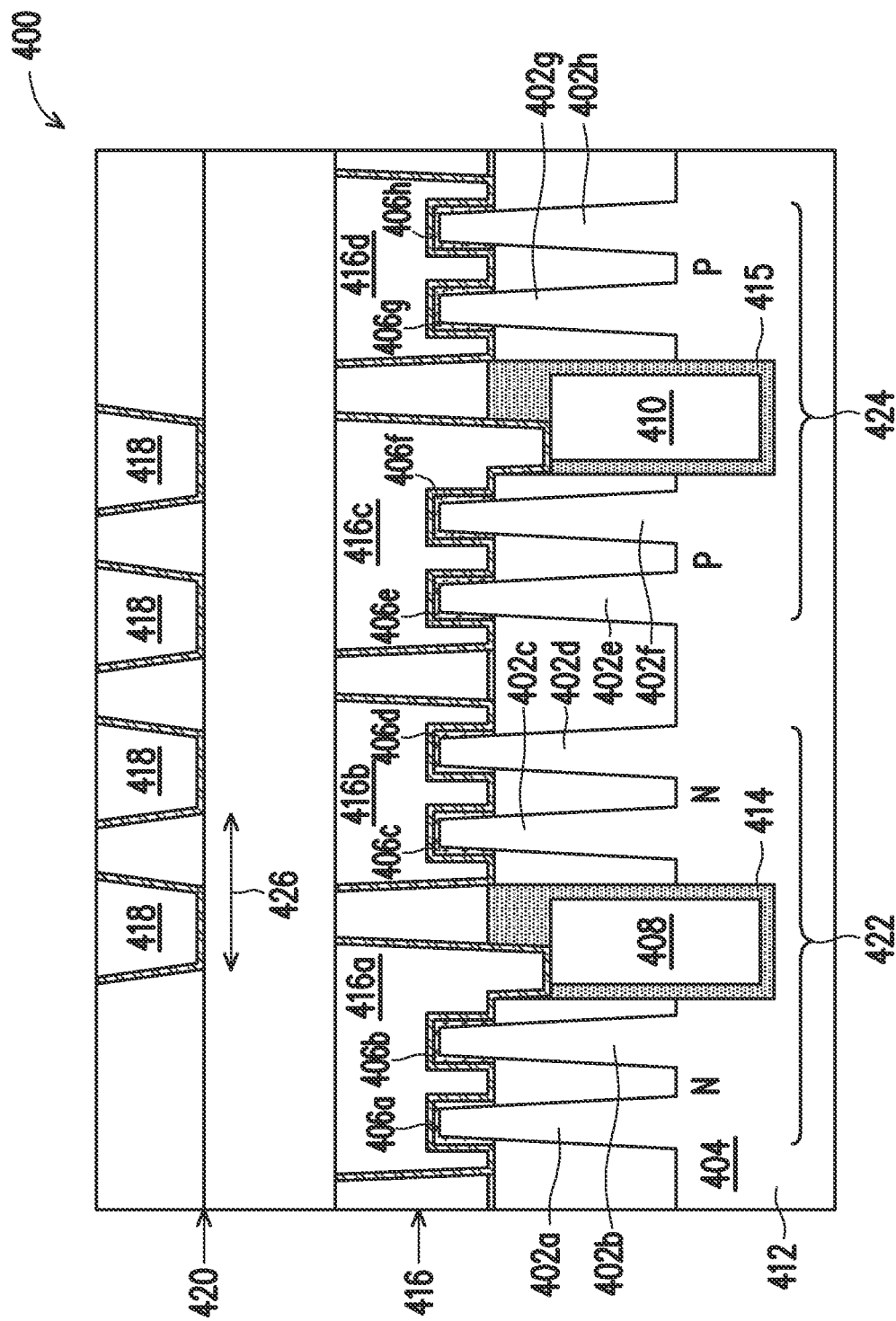
FIG. 4 illustrates a cross-sectional view of example transistor fin structures with backside power rails in accordance with some embodiments.

FIG. 4 illustrates a cross-sectional view of example transistor fin structures with backside power rails in accordance with some embodiments. The circuitry 400 includes fin structures 402a, 402b, 402c, 402d, 402e, 402f, 402g, 402h disposed on a substrate 404. Polysilicon ("poly") lines 406a, 406b, 406c, 406d, 406e, 406f, 406g, 406h are disposed over respective fin structures 402a, 402b, 402c, 402d, 402e, 402f, 402g, 402h and are adjacent to multiple (e.g., three or four) side surfaces of the fin structures 402a, 402b, 402c, 402d, 402e, 402f, 402g, 402h. The poly lines 406a, 406b, 406c, 406d, 406e, 406f, 406g, 406h may serve as gate electrodes of the transistors (e.g., MOS or field effect transistors) in the circuitry 400. The switching devices shown in FIGS. 2, 3, 9, 11, 13, and 15 that are suitable for use in the header circuitry shown in FIG. 2 can be formed using one or more of the example fin structures and backside power rails.

The fin structures 402a, 402b, 402c, 402d, 402e, 402f, 402g, 402h serve as active regions of the transistors in the circuitry 400. Specifically, the fin structures 402a, 402b, 402c, 402d, 402e, 402f, 402g, 402h may serve as channel regions of the transistors when positioned below any of the poly lines 406a, 406b, 406c, 406d, 406e, 406f, 406g, 406h. A memory cell (e.g., memory cell 108 in FIG. 1) can include one or more fin structures. In a non-limiting example, each memory cell includes two fin structures. Thus, the fin structures 402a, 402b are disposed in a first memory cell, the fin structures 402c, 402d in a second memory cell, the fin structures 402e, 402f in a third memory cell, and the fin structures 402g, 402h in a fourth memory cell.

The illustrated circuitry 400 includes a first power rail 408 and a second power rail 410 positioned adjacent to the backside 412 of the substrate 404. As such, the first and the second power rails 408, 410 are referred to as the first backside power rail (BPR) 408 and the second BPR 410, respectively. The first and the second BPRs 408, 410 are disposed in first diffusion regions 414, 415, respectively. The first diffusion regions 414, 415 are formed below a metal to diffusion (MD) layer 416. Metal tracks 418 are disposed in a first metal (M0) layer 420 positioned over the MD layer 416. Power (e.g., voltage) is brought up from the first and the second BPRs 408, 410 to the M0 layer 420 via the MD layer 416 (e.g., through MDs 416a, 416b, 416c, 416d).

In this embodiment, the first BPR 408 is interposed between the fin structure 402b and the fin structure 402c. The first BPR 408 may provide a first voltage to one or more transistors in the circuitry 400. In one embodiment, the first voltage is VSS. Alternatively, in another embodiment, the first voltage is ground.

The second BPR 410 is interposed between the fin structure 402f and the fin structure 402g. The second BPR 410 may provide a second voltage to one or more transistors in the circuitry 400. In one embodiment, the second voltage is VDD.

One advantage to the circuitry layout is that both a source node and a drain node in the circuitry 400 can be operably connected to a respective voltage source (e.g., VDD or VSS) through a BPR. The first BPR 408 is disposed in an n-type region 422 of the circuitry 400 to provide the first voltage source while the second BPR 410 is disposed in a p-type region 424 of the circuitry 400 to provide the second voltage source. For example, in one embodiment, the first voltage source is VSS or ground and the second voltage source is VDD. The layout design for the circuitry 400 maintains spacing rules for true power to virtual power when both the drain node and the source node are connected to the first and the second BPRs 408, 410.

Additionally or alternatively, the metal tracks 418 in the first metal layer 420 (e.g., the M0 layer) can be implemented with a wider metal pitch 426 compared to conventional transistor fin structure layouts that include one or more power rails in the M0 layer 420, where a power rail (e.g., a frontside power rail) is positioned alongside one or more of the metal tracks. Unlike the conventional transistor fin structure layouts, the layout of the circuitry 400 does not include any power rails in the M0 layer 420.

Figure 5:
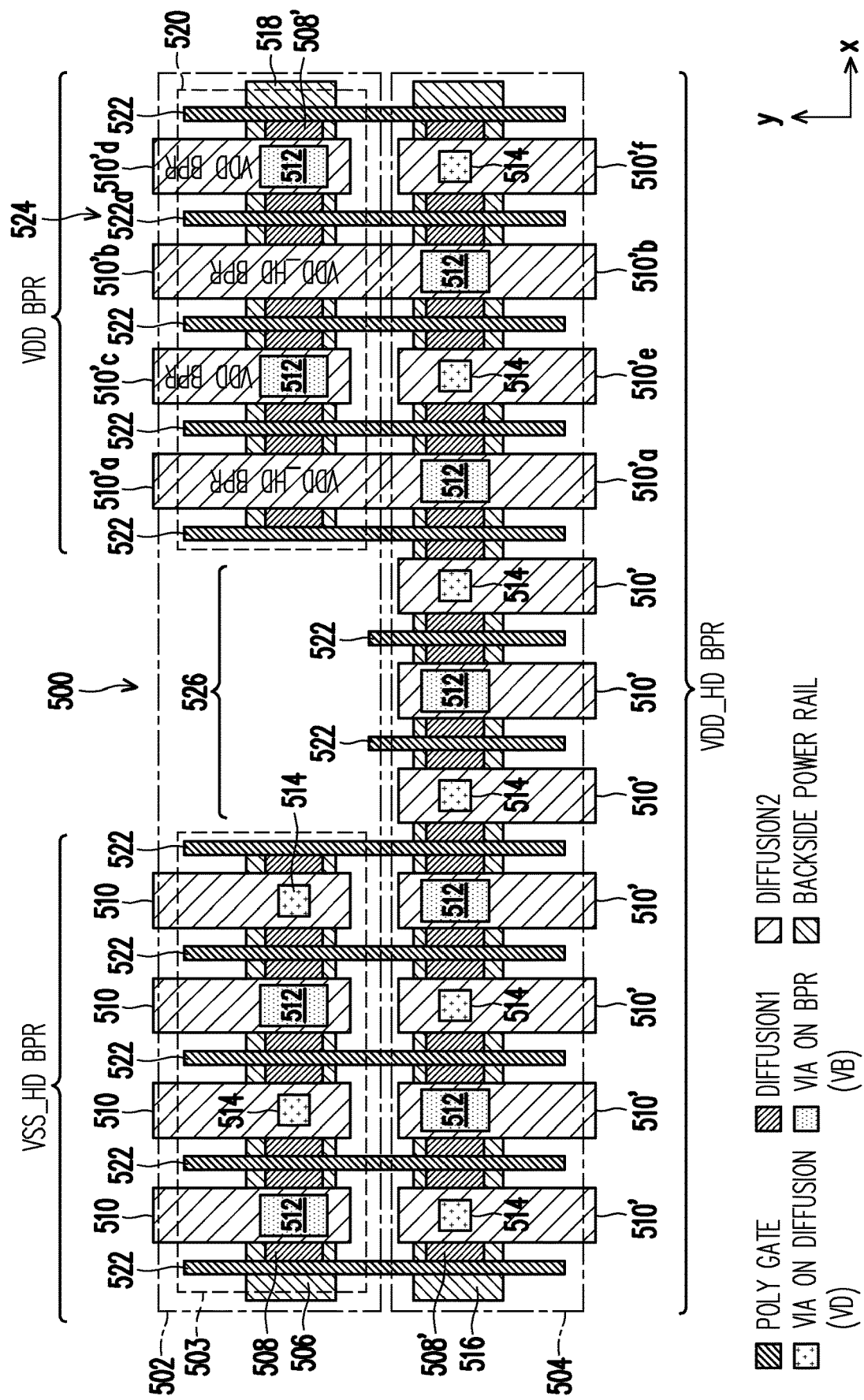
FIG. 5 depicts a first layout diagram for example header circuitry that includes the first switching device shown in FIG. 2 in accordance with some embodiments.

FIG. 5 depicts a first layout diagram for example header circuitry that includes the first switching device shown in FIG. 2 in accordance with some embodiments. As shown in FIG. 2, the first switching device is implemented as a p-type transistor. For clarity, the M0 layer is not shown in FIG. 5.

The layout 500 includes an n-type region 502 and a p-type region 504. In an example embodiment, the n-type region 502 is formed in one row (e.g., ROW0) and the p-type region 504 is disposed in another row (e.g., ROW1). The n-type region 502 includes both n-type and p-type transistors and the p-type region 504 includes p-type transistors.

An n-type section 503 in the n-type region 502 includes a first BPR 506 disposed in the x direction. The first BPR 506 provides a first voltage source (e.g., VSS_HD BPR shown in FIG. 3) to the header circuitry. A first diffusion region 508 is disposed in the x-direction overlying the first BPR 506. The first diffusion region 508 in the n-type section 503 has an n-type conductivity and can be doped with one or more n-type dopants.

Second diffusion regions 510 are disposed in they direction over the first BPR 506 and the first diffusion region 508. The second diffusion regions 510 in the n-type section 503 also have an n-type conductivity and can be doped with one or more n-type dopants.

The first BPR 506 can be operably connected to one or more source/drain nodes (e.g., first node 304 in FIG. 3) and/or to one or more metal tracks in a metal layer (e.g., M0 layer) through a conductive via to BPR ("VB") 512. The first BPR 506 can also be connected to one or more source/drain regions and/or one or more metal tracks in a metal layer (e.g., M0 layer) through a conductive via to diffusion ("VD") 514.

The p-type region 504 includes a second BPR 516 disposed in the x direction that provides a second voltage source (e.g., VDD_HD BPR shown in FIG. 2) to the header circuitry. A first diffusion region 508' extends continuously across the p-type region 504 and is disposed in the x-direction overlying the second BPR 516. The first diffusion region 508' in the p-type region 504 has a p-type conductivity and can be doped with one or more p-type dopants.

Second diffusion regions 510' are disposed in they direction over the second BPR 516 and the first diffusion region 508'. The second diffusion regions 510' in the p-type region 504 has a p-type conductivity and can be doped with one or more p-type dopants. In the illustrated embodiment, the second diffusion regions 510' are separate and distinct regions from the second diffusion regions 510.

The second BPR 516 can be operably connected to one or more source/drain nodes (e.g., drain node 208 in FIG. 2) and/or to one or more metal tracks in a metal layer (e.g., M0 layer) through the VB 512. The second BPR 516 can also be connected to one or more source/drain nodes and/or to one or more metal tracks in a metal layer (e.g., M0 layer) through the VD 514.

The n-type region 502 further includes a third BPR 518 disposed in the x direction that provides a third voltage source (e.g., VDD BPR shown in FIG. 2) to the header circuitry. The third BPR 518 is included in a p-type island section 520 that is located in the n-type region 502. The third BPR 518 can be operably connected to one or more source/drain nodes (e.g., first node 204 in FIG. 2) and/or one or more metal tracks in a metal layer (e.g., M0 layer) through a VB 512. The third BPR 518 is separate and distinct from the first BPR 506 in the n-type section 503.

The p-type island section 520 also includes the first diffusion region 508' and the second diffusion regions 510'. The first diffusion region 508' is disposed in the x-direction and overlying the third BPR 518. The first diffusion region 508' in the p-type island section 520 is separate and distinct from the first diffusion region 508 in the n-type section 503.

The second diffusion regions 510' are disposed in they direction over the first diffusion region 508' and the third BPR 518. In the illustrated embodiment, the second diffusion regions 510'a and 510'b extend across both the p-type region 504 and the p-type island section 520. The second diffusion regions 510'c and 510'd are distinct second diffusion regions that are located only in the p-type island section 520 and the second diffusion regions 510'e and 510'f are distinct second diffusion regions that are located only in the p-type region 504. All remaining second diffusion regions 510, 510' are distinct second diffusion regions that are positioned in the n-type section 503 and in the p-type region 504.

In the illustrated embodiment, the second BPR 516 provides the VDD_HD BPR power source to the header circuitry and the third BPR 518 provides the VDD BPR power source to the header circuitry. The extended second diffusion regions 510'a, 510'b and the VBs 512 provide the second voltage source (e.g., VDD_HD BPR) to the p-type island section 520, and the second diffusion regions 510'c, 510'd and the VBs 512 provide the third voltage source (e.g., VDD BPR) to the p-type island section 520. In a non-limiting example, the VDD_HD BPR power source and the VDD BPR power source can be used by one or more p-type transistors in the p-type island section 520 (e.g., p-type transistor 524 formed by second diffusion regions 510'b, 510'd and poly line 522a).

Poly lines 522 (e.g., poly gates) are disposed in the y direction over the first diffusion regions 508, 508', the first BPR 506, the second BPR 516, and the third BPR 518. The poly lines 522 are also positioned between the second diffusion regions 510, 510'. The poly lines 522 extend across the n-type region 502 and the p-type region 504, except for the area 526 between the n-type section 503 and the p-type island section 520. In the area 526, the poly lines 522 only extend across the p-type region 504.

Figure 6:
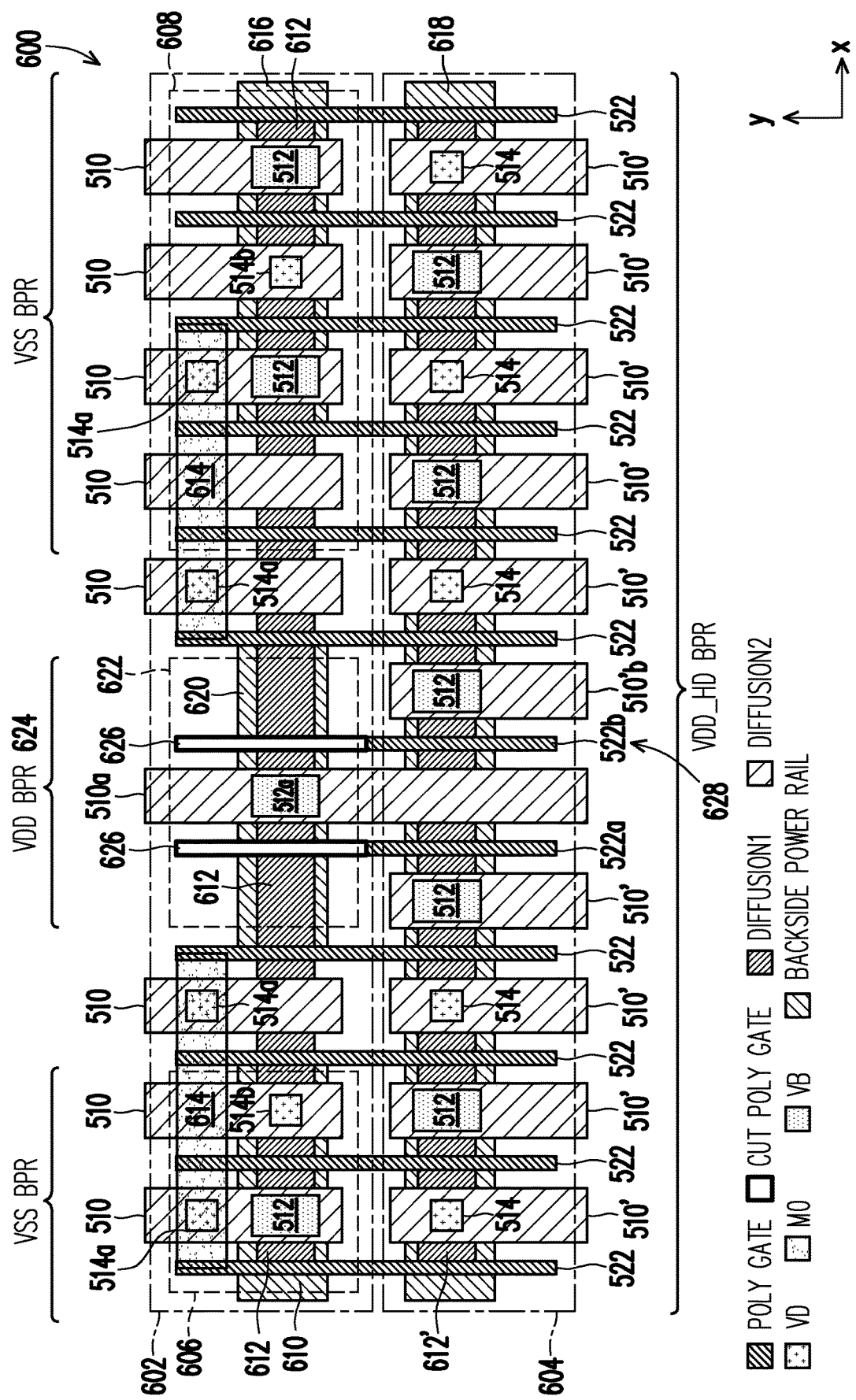
FIG. 6 illustrates a second layout diagram for example header circuitry that includes the first switching device shown in FIG. 2 in accordance with some embodiments.

FIG. 6 illustrates a second layout diagram for example header circuitry that includes the first switching device shown in FIG. 2 in accordance with some embodiments. The layout 600 includes an n-type region 602 and a p-type region 604. In an example embodiment, the n-type region 602 is formed in one row (e.g., ROW0) and the p-type region 604 is disposed in another row (e.g., ROW1). The n-type region 602 includes both n-type and p-type transistors and the p-type region 604 includes p-type transistors.

The n-type region 602 includes a first n-type section 606 and a second n-type section 608. The first n-type section 606 includes a first BPR 610 disposed in the x direction that provides a first voltage source (e.g., VSS BPR shown in FIG. 3) to the header circuitry. A first diffusion region 612 is disposed in the x-direction overlying the first BPR 610. Unlike the embodiment shown in FIG. 5, the first diffusion region 612 is a continuous first diffusion region that extends across the entire n-type region 602.

Second diffusion regions 510 are disposed in they direction over the first diffusion region 612 and the first BPR 610. The first BPR 610 can be operably connected to one or more source/drain nodes (e.g., source node 308 in FIG. 3) through a VB 512. The first BPR 610 is connected to the first metal layer 614 (e.g., M0 layer 420 in FIG. 4) through a VD 514a and to one or more source/drain regions through a VD 514b.

The second n-type section 608 includes a second BPR 616 disposed in the x direction that provides the first voltage (e.g., VSS BPR shown in FIG. 3) to the header circuitry. The first diffusion region 612 is disposed in the x-direction overlying the second BPR 616. Second diffusion regions 510 are disposed in they direction over the first diffusion region 612 and the second BPR 616. The second BPR 616 can be operably connected to one or more source/drain nodes (e.g., source node 308 in FIG. 3) through a VB 512. The second BPR 616 can also be operably connected to one or more metal tracks in the M0 layer 614 through a VD 514a and to one or more source/drain regions through a VD 514b.

The p-type region 604 includes a third BPR 618 that is disposed in the x direction and provides a second voltage (e.g., VDD_HD BPR shown in FIG. 2) to the header circuitry. A first diffusion region 612' is disposed in the x-direction overlying the third BPR 618. The third BPR 618 and the first diffusion region 612' are continuous and extend across the p-type region 604. Second diffusion regions 510' are disposed in the y direction over the first diffusion region 612' and the third BPR 618. In the illustrated embodiment, except for second diffusion region 510a, the second diffusion regions 510 are separate and distinct regions from the second diffusion regions 510'.

The third BPR 618 can be operably connected to one or more source/drain nodes (e.g., drain node 208 in FIG. 2) and/or to one or more metal tracks in a metal layer (e.g., M0 layer; not shown) through the VB 512. The third BPR 618 can also be operably connected to one or more source/drain nodes and/or to one or more other metal tracks in a metal layer (e.g., M0 layer; not shown) through the VD 514.

The n-type region 602 further includes a fourth BPR 620 disposed in the x direction that provides a third voltage (e.g., VDD BPR shown in FIG. 2) to the header circuitry. The fourth BPR 620 is included in a p-type island section 622 that is located in the n-type region 602. The fourth BPR 620 is separate and distinct from the first and the second BPRs 610, 616 in the n-type region 602.

The p-type island section 622 also includes the first diffusion region 612 disposed in the x-direction and overlying the fourth BPR 620, and a second diffusion region 510a disposed in the y direction over the first diffusion region 612 and the fourth BPR 620. In the illustrated embodiment, the second diffusion region 510a extends across both the p-type region 604 and the p-type island section 622. The second diffusion regions 510 in the first and the second n-type sections 606,608 and the second diffusion regions 510' in the p-type region 604 are distinct second diffusion regions that are located only in the first n-type section 606, the second n-type section 608, and the p-type region 604, respectively. The fourth BPR 620 can be operably connected to one or more source/drain nodes (e.g., first node 204 in FIG. 2) and/or one or more metal tracks in a metal layer (e.g., M0 layer; not shown) through VB 512.

Poly lines 522 (e.g., poly gates) are disposed in the y direction over the first diffusion regions 612, the first BPR 610, the second BPR 616, and the third BPR 618. The poly lines 522 are also positioned between the second diffusion regions 510, 510'. The poly lines 522 extend across the n-type region 602 and the p-type region 604, except for the area 624 (corresponds to the p-type island section 622 and the fourth BPR 620). The poly lines 522 in the area 624 only extend across the p-type region 604. The poly lines 522 are cut and are missing in the area 624 (missing poly lines represented by blocks 626). Cutting the poly lines 522 in the area 624 enables the first diffusion region 612 to be continuous across the n-type region 602, and enables the p-type island section 622 to be formed in the n-type region 602.

One advantage to the p-type island section 622 is that the fourth BPR 620 provides the third voltage source (e.g., VDD BPR) to the header circuitry (e.g., the p-type island section 622 and to the p-type region 604). The extended second diffusion region 510'a and the VB 512a provide the third voltage source to the p-type region 604. For example, the third voltage source VDD BPR can be used by one or more p-type transistors in the p-type region 604 (e.g., p-type transistor 628 formed by second diffusion regions 510a, 510'b and poly line 522b in the p-type region 604).

Figure 7:
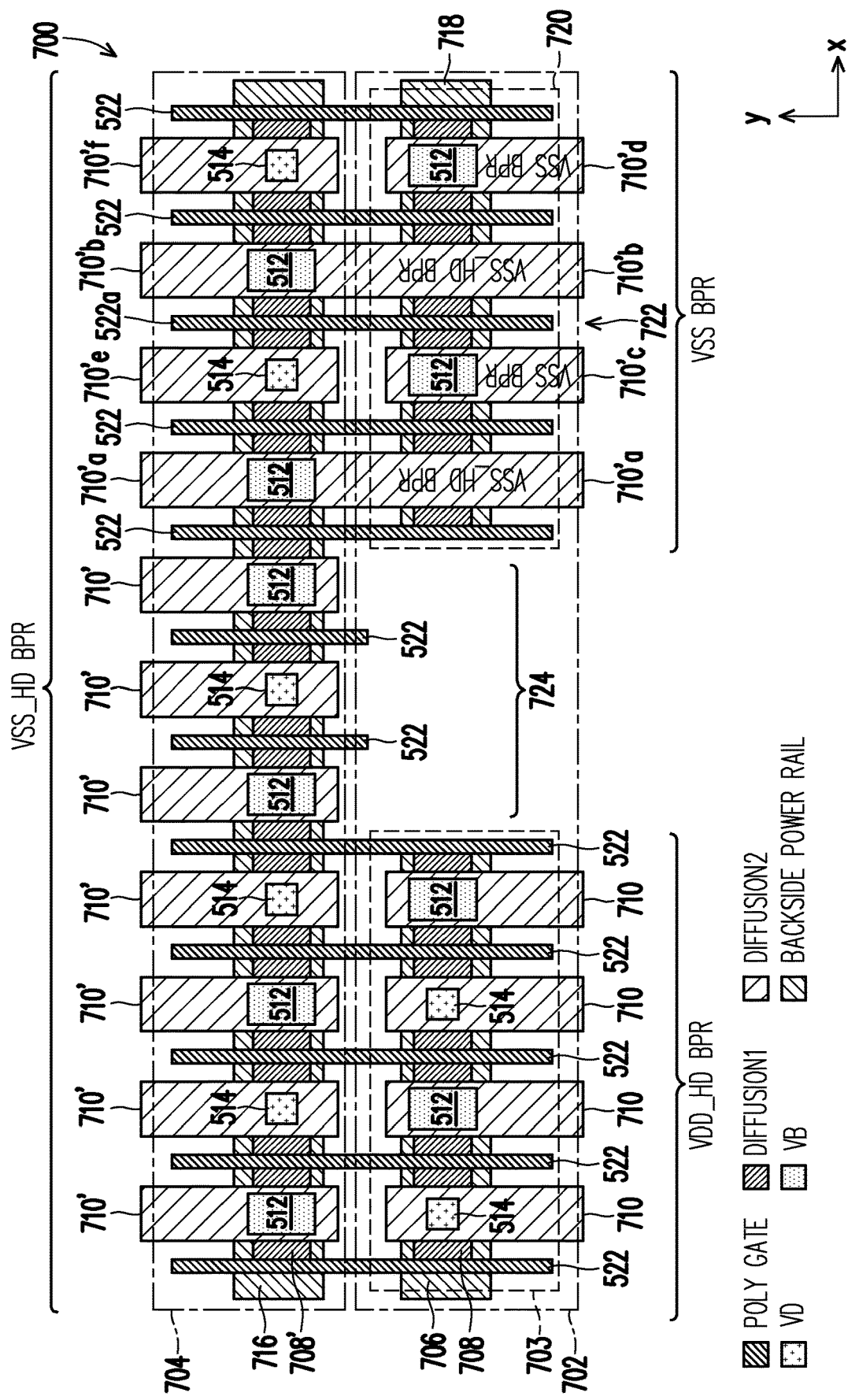
FIG. 7 depicts a first layout diagram for example header circuitry that includes the second switching device shown in FIG. 3 in accordance with some embodiments.

FIG. 7 depicts a first layout diagram for example header circuitry that includes the second switching device shown in FIG. 3 in accordance with some embodiments. As shown in FIG. 3, the second switching device is implemented as an n-type transistor. For clarity, the first metal layer (e.g., M0 layer) is not shown in FIG. 7.

The layout 700 includes a p-type section 703 in a p-type region 702 and an n-type region 704. The p-type section 703 includes a first BPR 706 disposed in the x direction that provides a first voltage source (e.g., VDD_HD BPR shown in FIG. 2) to the header circuitry. A first diffusion region 708 is disposed in the x-direction overlying the first BPR 706. Second diffusion regions 710 are disposed in the y direction over the first diffusion region 708 and the first BPR 706. The first BPR 706 can be operably connected to one or more source/drain nodes (e.g., drain node 208 in FIG. 2) and/or to one or more metal tracks in a metal layer (e.g., M0 layer) through a VB 512. The first BPR 706 can also be operably connected to one or more source/drain regions and/or one or more metal tracks in a metal layer (e.g., M0 layer) through a VD 514.

The n-type region 704 includes a second BPR 716 disposed in the x direction that provides a second voltage source (e.g., VSS_HD BPR shown in FIG. 3) to the header circuitry. A first diffusion region 708' is disposed in the x-direction overlying the second BPR 716. The second BPR 716 and the first diffusion region 708' are each continuous and extend across the n-type region 704.

The second diffusion regions 710' are disposed in the y direction over the first diffusion region 708' and the second BPR 716. The second BPR 716 can be operably connected to one or more source/drain nodes (e.g., first node 304 in FIG. 3) and/or to one or more metal tracks in a metal layer (e.g., M0 layer) through the VB 512. The second BPR 716 can also be operably connected to one or more source/drain nodes and/or to one or more other metal tracks in a metal layer (e.g., M0 layer) through the VD 514.

The p-type region 702 further includes a third BPR 718 disposed in the x direction that provides a third voltage source (e.g., VSS BPR shown in FIG. 3) to the header circuitry. The third BPR 718 is included in an n-type island section 720 that is located in the p-type region 702. The third BPR 718 can be operably connected to one or more source/drain nodes (e.g., source node 308 in FIG. 3) and/or one or more metal tracks in a metal layer (e.g., M0 layer) through a VB 512. The third BPR 718 is separate and distinct from the first BPR 706 in the p-type region 702.

The n-type island section 720 also includes the first diffusion region 708' and the second diffusion regions 710'. The first diffusion region 708' is disposed in the x-direction and overlying the third BPR 718. The first diffusion region 708' in the n-type island section 720 is separate and distinct from the first diffusion region 708 in the p-type section 703.

The second diffusion regions 710' are disposed in the y direction over the first diffusion region 708' and the third BPR 718. In the illustrated embodiment, the second diffusion regions 710'*a* and 710'*b* extend across both the n-type region 704 and the n-type island section 720. The second diffusion regions 710'*c* and 710'*d* are distinct second diffusion regions that are located only in the n-type island section 720. The second diffusion regions 710'*e* and 710'*f* are distinct second diffusion regions that are located only in the n-type region 704. All remaining second diffusion regions 710, 710' are distinct second diffusion regions that are positioned only in the n-type region 704 and the p-type section 703, respectively.

In the illustrated embodiment, the second BPR 716 provides the VSS_HD BPR power source and the third BPR 718 provides the VSS BPR power source to the header circuitry. The second diffusion regions 710'*a*, 710'*b* and the VBs 512 provide the second voltage source (e.g., VSS_HD BPR) to the n-type island section 720. The second diffusion regions 710'*c*, 710'*d* and the VBs 512 provide the third voltage source (e.g., VSS BPR) to the n-type island section 720. In a non-limiting example, the VSS_HD BPR power source and the VSS BPR power source can be used by one or more n-type transistors in the n-type island section 720 (e.g., n-type transistor 722 formed by second diffusion regions 710'*b*, 710'*c* and poly line 522*a*).

Poly lines 522 (e.g., poly gates) are disposed in the y direction over the first diffusion regions 708, 708', the first BPR 706, the second BPR 716, and the third BPR 718. The poly lines 522 are also positioned between the second diffusion regions 710, 710'. The poly lines 522 extend across the p-type region 702 and the n-type region 704, except for the area 724 between the p-type section 703 and the n-type island section 720 (e.g., between the first and the third BPRs 706, 718). The poly lines 522 in the area 724 only extend across the n-type region 704.

In FIG. 7, the n-type region 704 is formed in one row (e.g., ROW0) and the p-type region 702 is disposed in another row (e.g., ROW1). The n-type region 704 includes n-type transistors and the p-type region 702 includes both n-type and p-type transistors.

Figure 8:
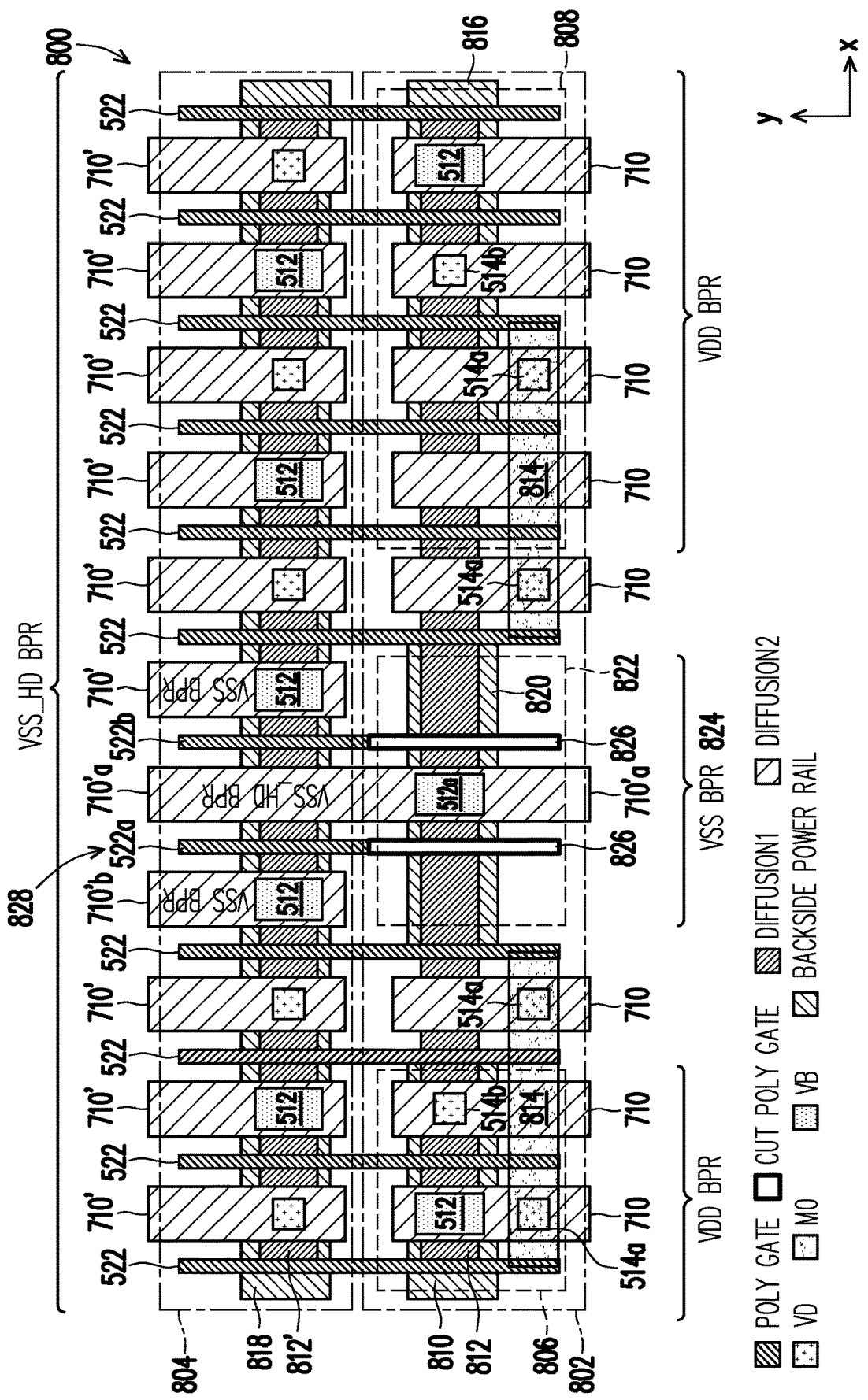
FIG. 8 illustrates a second layout diagram for example header circuitry that includes the second switching device shown in FIG. 3 in accordance with some embodiments.

FIG. 8 illustrates a second layout diagram for example header circuitry that includes the second switching device shown in FIG. 3 in accordance with some embodiments. The layout 800 includes a p-type region 802 and an n-type region 804. In an example embodiment, the n-type region 804 is formed in one row (e.g., ROW0) and the p-type region 802 is disposed in another row (e.g., ROW1). The p-type region 802 includes both n-type and p-type transistors and the n-type region 804 includes n-type transistors.

The p-type region 802 includes a first p-type section 806 and a second p-type section 808. The first p-type section 806 includes a first BPR 810 disposed in the x direction that provides a first voltage (e.g., VDD BPR shown in FIG. 2) to the header circuitry. A first diffusion region 812 is disposed in the x-direction overlying the first BPR 810. Unlike the embodiment shown in FIG. 7, the first diffusion region 812 is a continuous diffusion region that extends across the entire p-type region 802.

Second diffusion regions 710 are disposed in the y direction over the first diffusion region 812 and the first BPR 810. The first BPR 810 can be operably connected to one or more source/drain nodes (e.g., first node 204 in FIG. 2) through a VB 512. The first BPR 810 can also be operably connected to one or more metal tracks in the M0 layer 814 (e.g., M0 layer 420 in FIG. 4) through VD 514*a* and to one or more source/drain regions through VD 514*b*.

The second p-type section 808 includes a second BPR 816 disposed in the x direction that provides the first voltage (e.g., VDD BPR shown in FIG. 2) to the header circuitry. The first diffusion region 812 is disposed in the x-direction overlying the second BPR 816. Second diffusion regions 710 are disposed in the y direction over the first diffusion region 812 and the second BPR 816. The second BPR 816 can be operably connected to one or more source/drain nodes (e.g., first node 204 in FIG. 2) through a VB 512. The second BPR 816 can also be operably connected to one or more metal tracks in the M0 layer 814 through a VD 514*a* and to one or more source/drain regions through a VD 514*b*. The second BPR 816 is separate and distinct from the first BPR 810 in the first p-type section 806.

The n-type region 804 includes a third BPR 818 that is disposed in the x direction and provides a second voltage (e.g., VSS_HD BPR shown in FIG. 3) to the header circuitry. A first diffusion region 812' is disposed in the x-direction overlying the third BPR 818. The third BPR 818 and the first diffusion region 812' are continuous and extend across the n-type region 804.

The second diffusion regions 710' are disposed in the y direction over the first diffusion region 812' and the third BPR 818. The third BPR 818 can be connected to one or more source/drain nodes (e.g., first node 304 in FIG. 3) and/or to one or more metal tracks in a metal layer (e.g., M0 layer; not shown) through the VB 512.

The p-type region 802 further includes a fourth BPR 820 disposed in the x direction that provides a third voltage (e.g., VSS BPR shown in FIG. 3) to the header circuitry. The fourth BPR 820 is included in an n-type island section 822 that is located in the p-type region 802. The fourth BPR 820 is separate and distinct from the first and the second BPRs 810, 816 in the p-type region 802.

The n-type island section 822 also includes the first diffusion region 812' and the second diffusion region 710'*a*. The first diffusion region 812' is disposed in the x-direction over the fourth BPR 820. The second diffusion region 710'*a* disposed in the y direction over the first diffusion region 812' and the fourth BPR 820. In the illustrated embodiment, the second diffusion region 710'*a* extends across both the n-type region 804 and the n-type island section 822. The other second diffusion regions 710 in the first and the second p-type sections 806, 808 and the second diffusion regions 710' in the n-type region 804 are distinct diffusion regions that are located only in the first p-type section 806, the second p-type section 808, and the n-type region 804, respectively. The fourth BPR 820 can be operably connected to one or more source/drain nodes (e.g., source node 308 in FIG. 3) and/or one or more metal tracks in a metal layer (e.g., M0 layer; not shown) through VB 512.

Poly lines 522 (e.g., poly gates) are disposed in the y direction over the first diffusion regions 812, 812', the first BPR 810, the second BPR 816, and the third BPR 818. The poly lines 522 are also positioned between the second diffusion regions 710, 710'. The poly lines 522 extend across the p-type region 802 and the n-type region 804, except for the area 824 between the first and the second p-type sections 806, 808 (corresponds to the n-type island section 822 and the fourth BPR 820). The poly lines 522 in the area 824 only extend across the n-type region 804. The poly lines 522 are cut and are missing in the area 824 (missing poly lines represented by blocks 826). Cutting the poly lines 522 in the area 824 enables the first diffusion region 812 to be continuous across the p-type region 802, and enables the n-type island section 822 to be formed in the p-type region 802.

One advantage to the n-type island section 822 is that the fourth BPR 820 provides the third voltage source (e.g., VSS BPR) to the header circuitry (e.g., to the n-type island section 820 and to the n-type region 804). The extended second diffusion region 710'*a* and the VB 512*a* in the n-type island section 820 provide the third voltage source to the n-type region 804. For example, the third voltage source VSS BPR can be used by one or more n-type transistors in the n-type region 804 (e.g., n-type transistor 828 formed by second diffusion regions 710'*a*, 710'*b* and poly line 522*a* in the n-type region 804).

Figure 9:
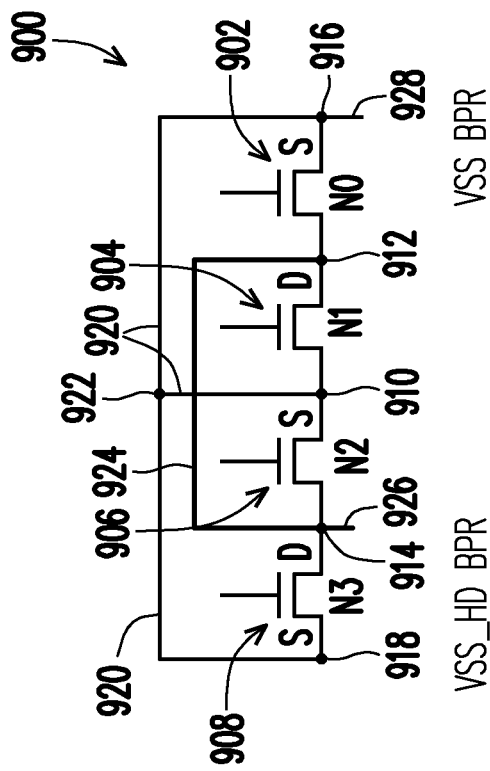
FIG. 9 depicts a third switching device that is suitable for use in the header circuitry shown in FIG. 1 in accordance with some embodiments.

FIG. 9 depicts a third switching device that is suitable for use in the header circuitry shown in FIG. 1 in accordance with some embodiments. The switching device 900 includes a first n-type transistor (N0) 902, a second n-type transistor (N1) 904, a third n-type transistor (N2) 906, and a fourth n-type transistor (N3) 908 operably connected in series. The source node (S) of the second n-type transistor 904 is connected to the source node (S) of the third n-type transistor 906 at node 910. The drain nodes (D) of the first and the second n-type transistors 902, 904 are connected together at node 912 and the drain nodes (D) of the third and the fourth n-type transistors 906, 908 are connected together at node 914. In the illustrated embodiment, the source node (S) of the first n-type transistor 902 (node 916) is connected to the source node (S) of the fourth n-type transistor 908 (node 918) by a first jumper connector 920. The node 910 is connected to the source nodes (S) of the first and the fourth n-type transistors 902, 908 (at node 922) by the first jumper connector 920.

A second jumper connector 924 connects node 912 to node 914. The node 914 (e.g., the drain nodes (D) of n-type transistors 906, 908) is connected to a first voltage source (e.g., VSS_HD BPR shown in FIG. 3) via signal line (or connection) 926. The node 916 (e.g., the source nodes (S) of the n-type transistors 902, 908) is connected to a second voltage source (e.g., VSS BPR shown in FIG. 3) via the signal line (or connection) 928.

Figure 10:
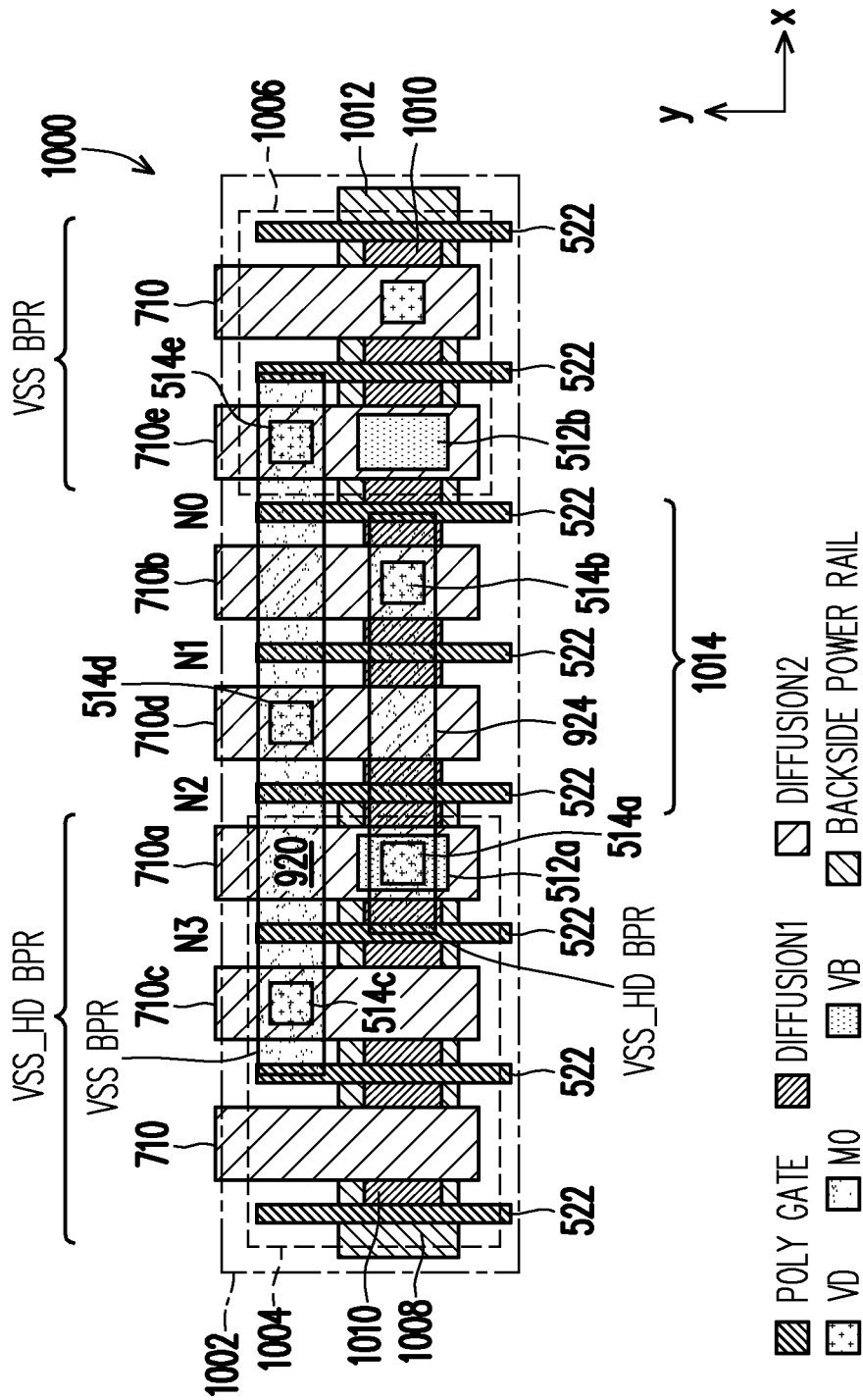
FIG. 10 illustrates a layout diagram for example header circuitry that includes the third switching device shown in FIG. 9 in accordance with some embodiments.

FIG. 10 illustrates a layout diagram for example header circuitry that includes the third switching device shown in FIG. 9 in accordance with some embodiments. The layout 1000 includes an n-type region 1002 that includes a first n-type section 1004 and a second n-type section 1006. In an example embodiment, the n-type region 1002 is formed in one row in the header circuitry.

The first n-type section 1004 includes a first BPR 1008 disposed in the x direction that provides the first voltage source (e.g., VSS_HD BPR) to the header circuitry (e.g., to the third switching device 900 shown in FIG. 9). A first diffusion region 1010 extends uninterrupted (e.g., continuously) across the n-type region 1002 in the x-direction and is disposed over the first BPR 1008.

The second n-type section 1006 includes a second BPR 1012 disposed in the x direction that provides the second voltage source (e.g., VSS BPR) to the header circuitry (e.g., to the third switching device 900 shown in FIG. 9). The continuous first diffusion region 1010 is disposed over the second BPR 1012. In the illustrated embodiment, the area 1014 in the n-type region 1002 between the first and the second n-type sections 1004, 1006 includes the first n-type transistor (N0), the second n-type transistor (N1), and the third n-type transistor (N2). The fourth n-type transistor (N3) is disposed in the first n-type section 1004.

Second diffusion regions 710 are disposed in the y direction across the n-type region 1002, and over the first diffusion region 1010, the first BPR 1008, and the second BPR 1012. The second diffusion region 710*a* is connected to the second jumper connector 924 through VD 514*a*. The second diffusion region 710*b* is connected to the second jumper connector 924 through VD 514*b*. The second jumper connector 924 provides the first voltage (e.g., VSS_HD BPR) and is formed in the first metal layer (e.g., M0 layer).

Poly lines 522 (e.g., poly gates) are disposed in the y direction over the first diffusion region 1010, the first BPR 1008, the second BPR 1012 and between the second diffusion regions 710. The poly lines 522 extend across the n-type region 1002.

The second diffusion region 710*c* is connected to the first jumper connector 920 by VD 514*c*. The second diffusion region 710*d* is connected to the first jumper connector 920 by VD 514*d*. The second diffusion region 710*e* is connected to the first jumper connector 920 by VD 514*e*. The first jumper connector 920 provides the second voltage (e.g., VSS BPR) and is formed in the first metal layer (e.g., M0 layer).

One advantage to the illustrated embodiment is that the first and the second jumper connectors 920, 924 provide the first and the second voltage sources (e.g., VSS_HD BPR and VSS BPR, respectively) to the first and the second n-type sections 1004, 1006. The drains (D) of the first, the second, the third, and the fourth n-type transistors 902, 904, 906, 908 are connected to the first voltage source (VSS_HD BPR) while the sources (S) of the first, the second, the third, and the fourth n-type transistors 902, 904, 906, 908 are connected to the second voltage source (VSS BPR).

Figure 11:
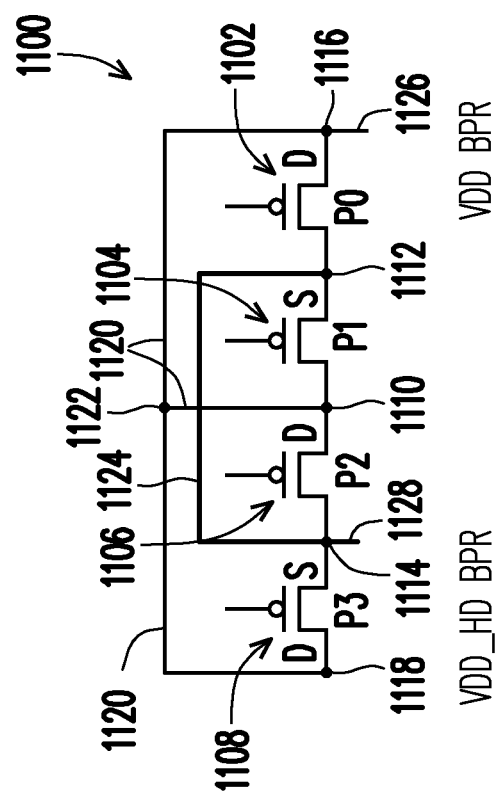
FIG. 11 depicts a fourth switching device that is suitable for use in the header circuitry shown in FIG. 1 in accordance with some embodiments.

FIG. 11 depicts a fourth switching device that is suitable for use in the header circuitry shown in FIG. 1 in accordance with some embodiments. The fourth switching device 1100 includes a first p-type transistor (P0) 1102, a second p-type transistor (P1) 1104, a third p-type transistor (P2) 1106, and a fourth p-type transistor (P3) 1108 operably connected in series. In the illustrated embodiment, the drain node (D) of the second p-type transistor 1104 is connected to the drain node (D) of the third p-type transistor 1106 at node 1110. The source nodes (S) of the first and the second p-type transistors 1102, 1104 are connected together at node 1112 and the source nodes (S) of the third and the fourth p-type transistors 1106, 1108 are connected together at node 1114. The drain node (D) of the first p-type transistor 1102 (node 1116) is connected to the drain node (D) of the fourth p-type transistor 1108 (node 1118) by a first jumper connector 1120. The node 1110 is connected to the drain nodes (D) of the first and the fourth p-type transistors 1102, 1108 at node 1122 by the first jumper connector 1120.

A second jumper connector 1124 connects node 1112 to node 1114. The node 1116 (e.g., the source (S) of first p-type transistor 1102) is connected to a first voltage source (e.g., VDD BPR shown in FIG. 2) via the signal line (or connection) 1126. The node 1114 (e.g., the source nodes (S) of p-type transistors 1106, 1108) is connected to a second voltage source (e.g., VDD_HD BPR shown in FIG. 2) via signal line (or connection) 1128.

Figure 12:
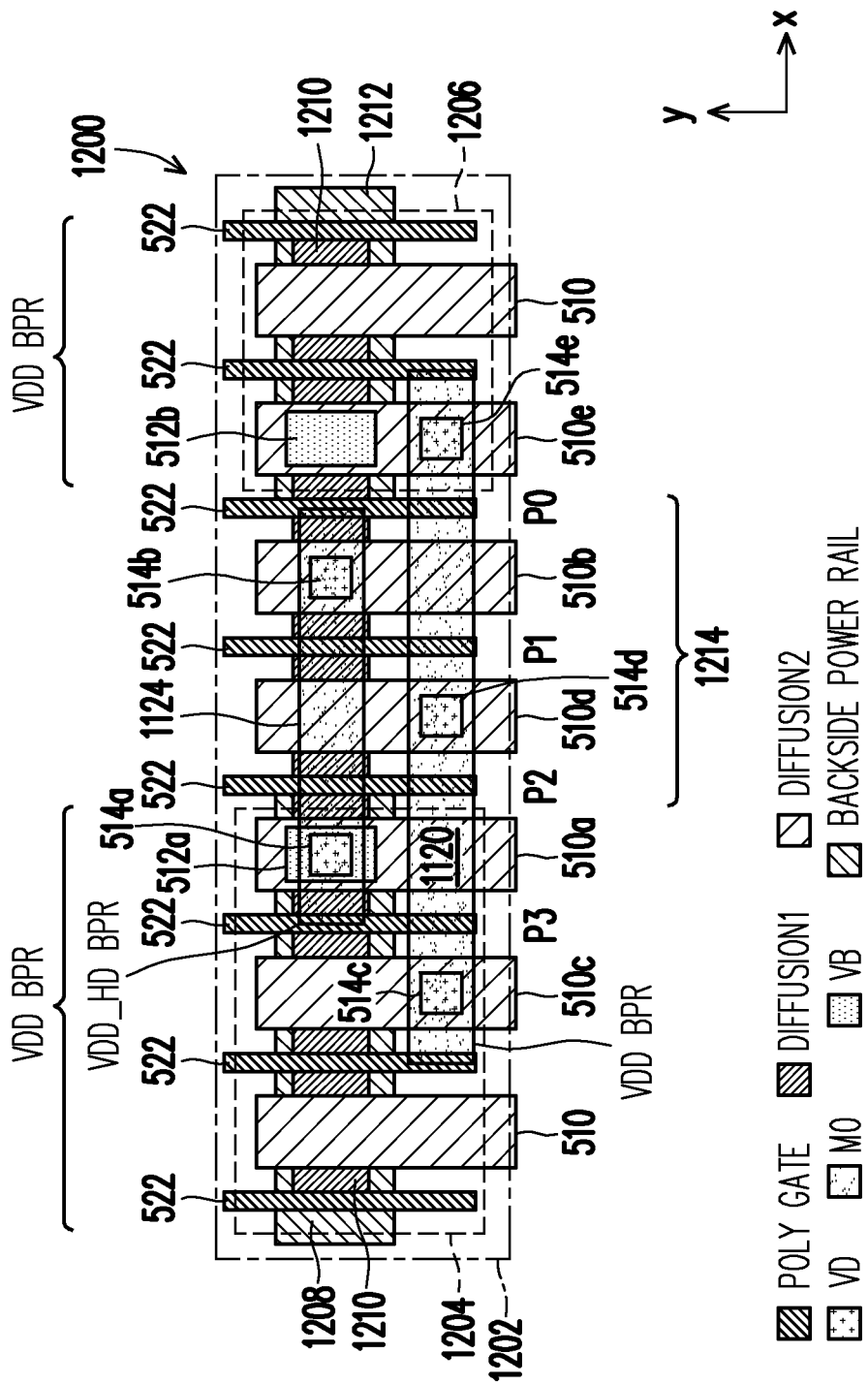
FIG. 12 illustrates a layout diagram for example header circuitry that includes the fourth switching device shown in FIG. 11 in accordance with some embodiments.

FIG. 12 illustrates a layout diagram for example header circuitry that includes the fourth switching device shown in FIG. 11 in accordance with some embodiments. The layout 1200 includes a p-type region 1202 that includes a first p-type section 1204 and a second p-type section 1206. In an example embodiment, the p-type region 1202 is formed in one row in the header circuitry.

The first p-type section 1204 includes a first BPR 1208 disposed in the x direction that provides the second voltage source (e.g., VDD_HD BPR) to the header circuitry (e.g., to the fourth switching device 1100 shown in FIG. 11). A first diffusion region 1210 extends uninterrupted (e.g., continuously) across the p-type region 1202 in the x-direction and is disposed over the first BPR 1208.

The second p-type section 1206 includes a second BPR 1212 disposed in the x direction that provides the first voltage source (e.g., VDD BPR) to the header circuitry (e.g., to the fourth switching device 1100 shown in FIG. 11). The first diffusion region 1210 is disposed over the second BPR 1212. In the illustrated embodiment, the area 1214 in the p-type region 1202 between the first and the second p-type sections 1204, 1206 includes the first p-type transistor (P0), the second p-type transistor (P1), and the third p-type transistor (P2). The fourth p-type transistor (P3) is disposed in the first p-type section 1204.

Second diffusion regions 510 are disposed in the y direction across the p-type region 1202, and over the first diffusion region 1210, the first BPR 1208, and the second BPR 1212. The second diffusion region 510a is connected to the second jumper connector 1124 through VD 514a. The second diffusion region 510b is connected to the second jumper connector 1124 through VD 514b. The second jumper connector 1124 provides the second voltage (e.g., VDD_HD BPR) and is formed in the first metal layer (e.g., M0 layer).

Poly lines 522 (e.g., poly gates) are disposed in the y direction over the first diffusion region 1210, the first BPR 1208, the second BPR 1212 and between the second diffusion regions 510. The poly lines 522 extend across the p-type region 1202.

The second diffusion region 510c is connected to the first jumper connector 1120 by VD 514c. The second diffusion region 510d is connected to the first jumper connector 1120 by VD 514d. The second diffusion region 510e is connected to the first jumper connector 1120 by VD 514e. In the illustrated embodiment, the first jumper connector 1120 provides the first voltage source (VDD BPR) and is formed in the first metal layer (e.g., M0 layer).

One advantage to the illustrated embodiment is that the first and the second jumper connectors 1120, 1124 provide the first and the second voltage sources (e.g., VDD BPR and VDD_HD BPR, respectively) to the first and the second p-type sections 1204, 1206. The drains (D) of the first, the second, the third, and the fourth p-type transistors 1102, 1104, 1106, 1108 are connected to the first voltage source (VDD BPR) while the sources (S) of the first, the second, the third, and the fourth p-type transistors 1102, 1104, 1106, 1108 are connected to the second voltage source (VDD_HD BPR).

Figure 13:
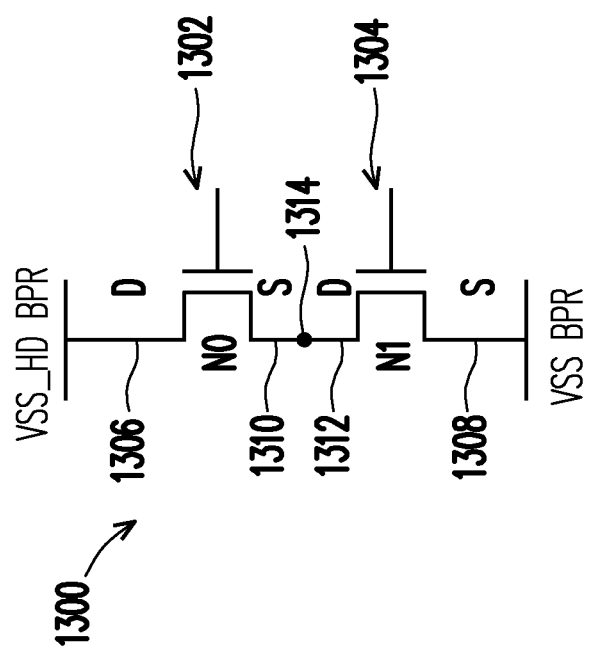
FIG. 13 depicts a fifth switching device that is suitable for use in the header circuitry shown in FIG. 1 in accordance with some embodiments.

FIG. 13 depicts a fifth switching device that is suitable for use in the header circuitry shown in FIG. 1 in accordance with some embodiments. The fifth switching device 1300 includes a first n-type transistor (N0) 1302 and a second n-type transistor (N1) 1304 connected in series. The drain node 1306 of the first n-type transistor 1302 is connected to a first voltage source (e.g., VSS_HD BPR). The source node 1308 of the second n-type transistor 1304 is connected to a second voltage source (e.g., VSS BPR). The source node 1310 of the first n-type transistor 1302 is connected to the drain node 1312 of the second n-type transistor 1304 at node 1314. In one example embodiment, the first and the second n-type transistors 1302, 1304 are implemented as two stacked NMOS transistors.

Figure 14:
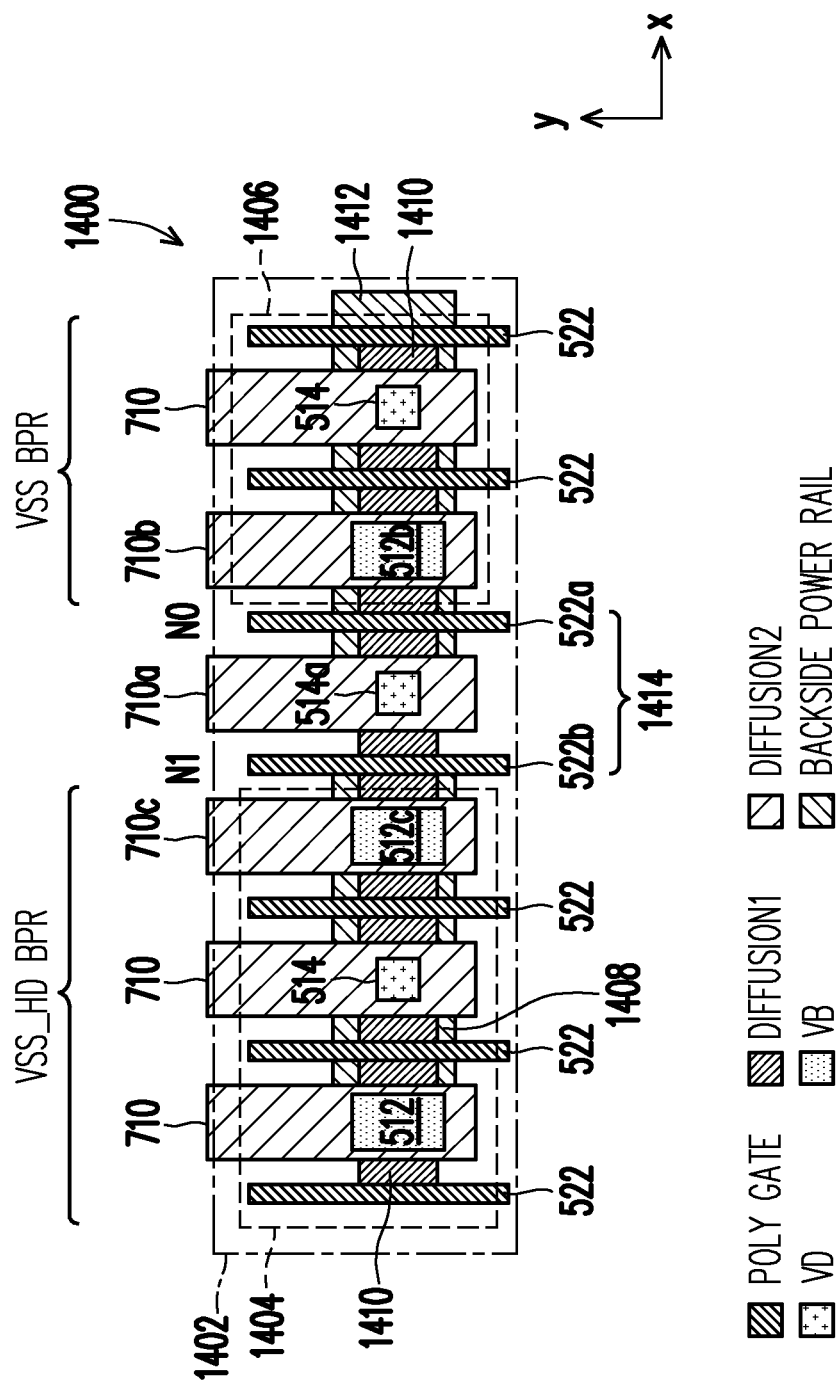
FIG. 14 illustrates a layout diagram for example header circuitry that includes the fifth switching device shown in FIG. 13 in accordance with some embodiments.

FIG. 14 illustrates a layout diagram for example header circuitry that includes the fifth switching device shown in FIG. 13 in accordance with some embodiments. The layout 1400 includes an n-type region 1402 that includes a first n-type section 1404 and a second n-type section 1406. In an example embodiment, the n-type region 1402 is formed in one row in the header circuitry.

The first n-type section 1404 includes a first BPR 1408 disposed in the x direction that provides the first voltage source (e.g., VSS_HD BPR) to the header circuitry (e.g., fifth switching device 1300 in FIG. 13). A first diffusion region 1410 extends uninterrupted (e.g., continuously) across the n-type region 1402 in the x-direction and is disposed over the first BPR 1408.

The second n-type section 1406 includes a second BPR 1412 disposed in the x direction that provides the second voltage source (e.g., VSS BPR) to the header circuitry (e.g., fifth switching device 1300 in FIG. 13). The continuous first diffusion region 1410 is also disposed over the second BPR 1412.

Second diffusion regions 710 are disposed in the y direction across the n-type region 1402 and over the first diffusion region 1410, the first BPR 1408, and the second BPR 1412. In the illustrated embodiment, the second diffusion region 710a is connected to the first diffusion region 1410 by VD 514a in the area 1414 and represents the connection between the source node 1310 and the drain node 1312 in FIG. 13 (node 1314).

The second BPR 1412 is connected to the second diffusion region 710b through VB 512b. VB 512b represents the connection between the drain node 1306 and the first voltage source (e.g., VSS_HD BPR). The first BPR 1408 is connected to the second diffusion region 710c through VB 512c. VB 512c represents the connection between the source node 1308 shown in FIG. 13 and the second voltage source (e.g., VSS BPR).

Poly lines 522 (e.g., poly gates) are disposed in the y direction over the first diffusion region 1410, the first BPR 1408, and the second BPR 1412. The poly lines 522 are also positioned between the second diffusion regions 710 and extend across the n-type region 1402. The poly lines 522a, 522b function as the gates of the n-type transistors (e.g., n-type transistors N0, N1 in FIG. 13). The first n-type transistor (N0) 1302 is formed by the first diffusion region 1410, the poly line 522a, and the second diffusion regions 710a, 710b while the second n-type transistor (N1) 1304 is formed by the first diffusion region 1410, the poly line 522b, and the second diffusion regions 710a, 710c.

Figure 15:
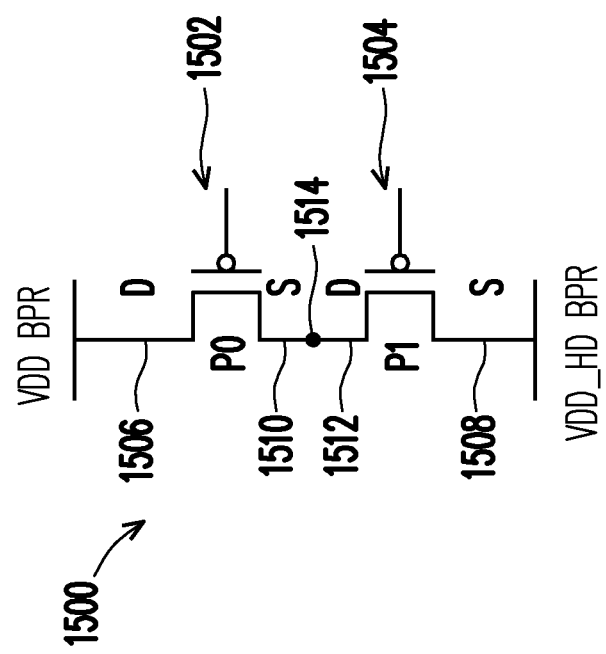
FIG. 15 depicts a sixth switching device that is suitable for use in the header circuitry shown in FIG. 1 in accordance with some embodiments.

FIG. 15 depicts a sixth switching device that is suitable for use in the header circuitry shown in FIG. 1 in accordance with some embodiments. The sixth switching device 1500 includes a first p-type transistor (P0) 1502 and a second p-type transistor (P1) 1504 connected in series. The drain node 1506 of the first p-type transistor 1502 is connected to a first voltage source (e.g., VDD BPR). The source node 1508 of the second p-type transistor 1504 is connected to a second voltage source (e.g., VDD_HD BPR). The source node 1510 of the first p-type transistor 1502 is connected to the drain node 1512 of the second p-type transistor 1504 at node 1514. In one example embodiment, the first and the second p-type transistors 1502, 1504 are implemented as two stacked PMOS transistors.

Figure 16:
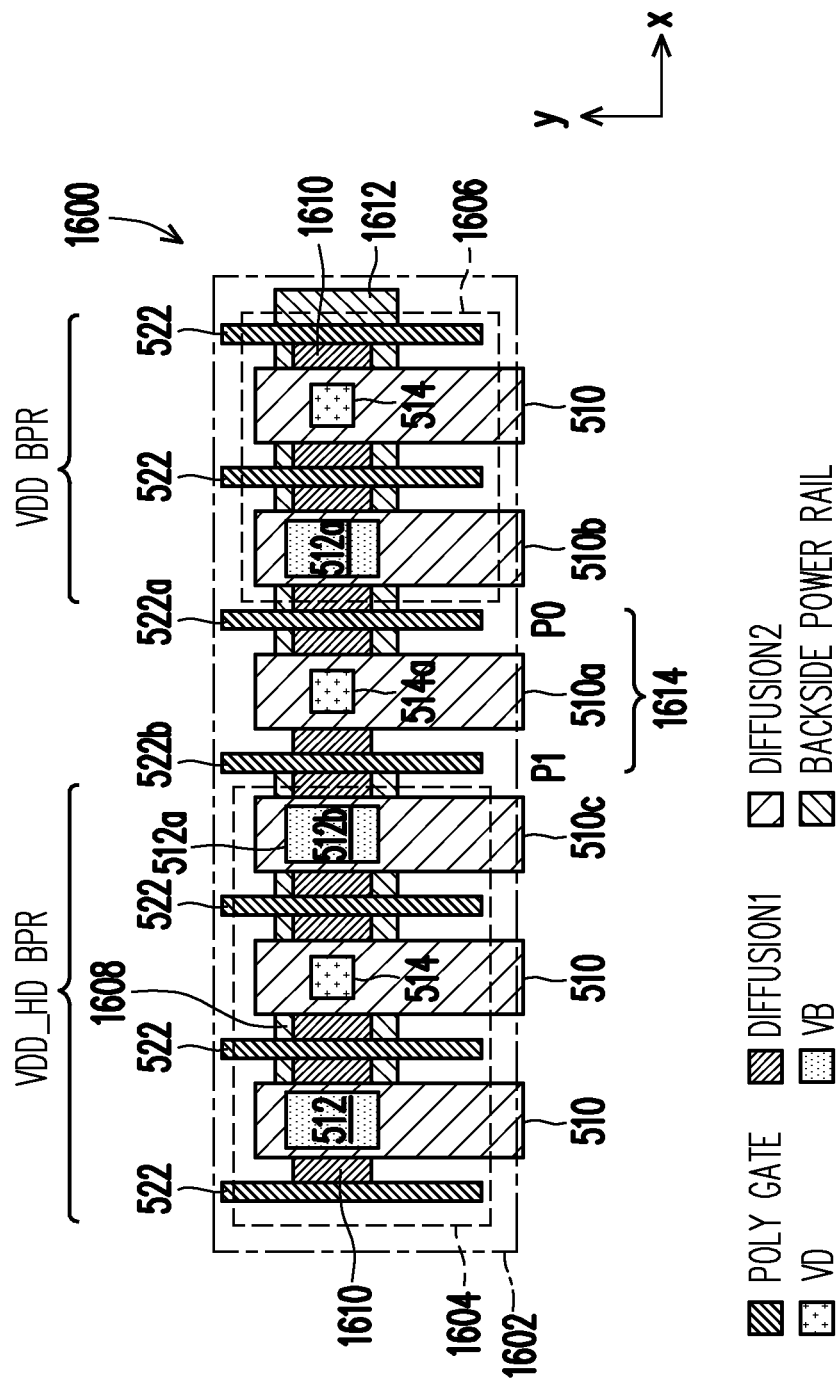
FIG. 16 illustrates a layout diagram for example header circuitry that includes the sixth switching device shown in FIG. 15 in accordance with some embodiments.

FIG. 16 illustrates a layout diagram for example header circuitry that includes the sixth switching device shown in FIG. 15 in accordance with some embodiments. The layout 1600 includes a p-type region 1602 that includes a first p-type section 1604 and a second p-type section 1606. In an example embodiment, the p-type region 1602 is formed in one row in the header circuitry.

The first p-type section 1604 includes a first BPR 1608 disposed in the x direction that provides the second voltage source (e.g., VDD_HD BPR) to the header circuitry (e.g., the sixth switching device 1500 in FIG. 15). A first diffusion region 1610 extends uninterrupted (e.g., continuously) across the p-type region 1602 in the x-direction and is disposed over the first BPR 1608.

The second p-type section 1606 includes a second BPR 1612 disposed in the x direction that provides the second voltage source (e.g., VDD BPR) to the header circuitry (e.g., sixth switching device 1500 in FIG. 15). The continuous first diffusion region 1610 is also disposed over the second BPR 1612.

Second diffusion regions 510 are disposed in the y direction across the p-type region 1602 and over the first diffusion region 1610, the first BPR 1608, and the second BPR 1612. In the illustrated embodiment, the second diffusion region 510a is connected to the first diffusion region 1610 by VD 514a in the area 1614 and represents the connection between the source node 1510 and the drain node 1512 in FIG. 15 (node 1514).

The second BPR 1612 is connected to the second diffusion region 510b through VB 512a. VB 512a represents the connection between the drain node 1506 and the first voltage source (e.g., VDD BPR). The first BPR 1608 is connected to the second diffusion region 510c through VB 512b. VB 512b represents the connection between the source node 1508 shown in FIG. 15 and the second voltage source (e.g., VSS_HD BPR).

Poly lines 522 (e.g., poly gates) are disposed in the y direction over the first diffusion region 1610, the first BPR 1608, and the second BPR 1612. The poly lines 522 are also positioned between the second diffusion regions 510 and extend across the p-type region 1602. The poly lines 522a, 522b function as the gates of the p-type transistors (e.g., p-type transistors P0, P1 in FIG. 15). The first p-type transistor (P0) 1502 is formed by the first diffusion region 1610, the poly line 522a, and the second diffusion regions 510a, 510b while the second p-type transistor (P1) 1504 is formed by the first diffusion region 1610, the poly line 522b, and the second diffusion regions 510a, 510c.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a header circuitry includes a plurality of switching devices for a memory array. The header circuitry includes a first region of a first conductivity type. The first region includes a first section and a second section. The first section includes a first backside power rail (BPR) disposed in a first direction, the first BPR comprising a first voltage source providing a first voltage. The second section includes a second BPR disposed in the first direction, the second BPR comprising a second voltage source providing a second voltage that is different from the first voltage.

In another aspect, a memory device includes a memory array and header circuitry. The header circuitry includes a plurality of switches that are operably connected to the memory array. The header circuitry includes a first region of a first conductivity type. The first region includes a first section and a second section. The first section includes a first backside power rail (BPR) disposed in a first direction, the first BPR comprising a first voltage source providing a first voltage. The second section includes a second BPR disposed in the first direction, the second BPR comprising a second voltage source providing a second voltage that is different from the first voltage.

In yet another aspect, an electronic device includes a processing device and a memory device operably connected to the processing device. The processing device is operable to control operations of the memory device. The memory device includes a memory array and header circuitry. The header circuitry includes a plurality of switches that are operably connected to the memory array. The header circuitry includes a first region of a first conductivity type. The first region includes a first section and a second section. The first section includes a first backside power rail (BPR) disposed in a first direction, the first BPR comprising a first voltage source providing a first voltage. The second section includes a second BPR disposed in the first direction, the second BPR comprising a second voltage source providing a second voltage that is different from the first voltage.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A header circuitry comprising a plurality of switching devices, the header circuitry comprising:
a first region of a first conductivity type;
a first section of the first conductivity type disposed in the first region comprising a first backside power rail (BPR) disposed in a first direction, the first BPR configured to provide a first voltage; and
a second section of a second conductivity type disposed in the first region comprising a second BPR disposed in the first direction, the second BPR configured to provide a second voltage that is different from the first voltage.

2. The header circuitry of claim 1, wherein:
the first conductivity type is an n-type conductivity; and
the second conductivity type is a p-type conductivity.

3. The header circuitry of claim 2, further comprising:
a second region of the second conductivity type disposed in the first direction adjacent the first region of the first conductivity type, the second region comprising a third BPR disposed in the first direction and configured to provide a third voltage that is different from the first and the second voltages;
a diffusion region disposed in a second direction and extending over the second BPR in the second section and the third BPR in the second region; and
a connection between the diffusion region and the third BPR to provide the third voltage to the second section.

4. The header circuitry of claim 2, further comprising:
a second region of the second conductivity type disposed in the first direction adjacent the first region of the first conductivity type, the second region comprising a third BPR disposed in the first direction and configured to provide a third voltage that is different from the first and the second voltages;
a diffusion region disposed in a second direction and extending over the second BPR in the second section and the third BPR in the second region; and
a connection between the diffusion region and the second BPR to provide the second voltage to the second region.

5. The header circuitry of claim 4, wherein:
the diffusion region is a first diffusion region;
the connection is a first connection; and
the header circuitry further comprises:
a second diffusion region disposed in the second direction over the first diffusion region and the first BPR; and
a second connection between the first BPR and a metal layer.

6. The header circuitry of claim 2, further comprising:
a second region of the first conductivity type:
a third section of the first conductivity type disposed in the second region comprising a third BPR disposed in the first direction, the third BPR configured to provide the first voltage (VSS_HD);
a fourth section of the first conductivity type disposed in the second region comprising a fourth BPR disposed in the first direction, the fourth BPR configured to provide a third voltage that is different from the first and the second voltages;
a first diffusion region disposed in the first direction over the third and the fourth BPRs;
a second diffusion region disposed in a second direction over the first diffusion region and the third BPR;
a first connection between the second diffusion region and the third BPR;
a third diffusion region disposed in the second direction over the first diffusion region and the fourth BPR;
a second connection between the third diffusion region and the fourth BPR;
a fourth diffusion region disposed in the second direction between the second and the third diffusion regions and over the first diffusion region;
a fifth diffusion region disposed in the second direction between a first side of the second diffusion region and the fourth diffusion region and over the first diffusion region;
a sixth diffusion region disposed in the second direction between a second side of the second diffusion region and over the first diffusion region and the third BPR, the second side opposite the first side;
a first jumper connector disposed in the first direction over the second, the fourth, and the fifth diffusion regions and over a portion of the first diffusion region;
a third connection between the second diffusion region and the first jumper connector;
a fourth connection between the first jumper connector and the fourth diffusion region;
a second jumper connector adjacent the first jumper connector and disposed in the first direction over the second, the third, the fourth, the fifth, and the sixth diffusion regions;
a fifth connection between the sixth diffusion region and the second jumper connector;
a sixth connection between the fifth diffusion region and the second jumper connector; and
a seventh connection between the third diffusion region and the second jumper connector.

7. The header circuitry of claim 2, further comprising:
a third section of the first conductivity type disposed in the first region comprising a third BPR disposed in the first direction, the third BPR configured to provide the first voltage;
a first diffusion region disposed in the first direction over the first and the second and the third BPRs;
a second diffusion region disposed in a second direction over the first diffusion region and the first BPR;
a first connection between the second diffusion region and the first BPR;
a third diffusion region disposed in the second direction over the first diffusion region and the second BPR;
a second connection between the third diffusion region and the second BPR;
a fourth diffusion region disposed in the second direction over the first diffusion region and the third BPR; and
a third connection between the fourth diffusion region and the third BPR.

8. A memory device, comprising:
a memory array; and
a header circuitry comprising a plurality of switching devices operably connected to the memory array, the header circuitry comprising:
a first region of a first conductivity type disposed in a substrate;
a first section of the first conductivity type disposed in the first region comprising a first backside power rail (BPR) disposed in a first direction, the first BPR configured to provide a first voltage; and a second section of a second conductivity type disposed in the first region comprising a second BPR disposed in the first direction, the second BPR configured to provide a second voltage that is different from the first voltage.

9. The memory device of claim 8, wherein:
the first conductivity type is a p-type conductivity; and
the second conductivity type is an n-type conductivity.

10. The memory device of claim 9, wherein the header circuitry further comprises:
a second region of the second conductivity type disposed in the first direction adjacent the first region of the first conductivity type, the second region comprising a third BPR disposed in the first direction and configured to provide a third voltage that is different from the first and the second voltages;
a diffusion region disposed in a second direction and extending over the second BPR in the second section and the third BPR in the second region; and
a connection between the diffusion region and the third BPR to provide the third voltage to the second section.

11. The memory device of claim 9, wherein the header circuitry further comprises:
a second region of the second conductivity type disposed in the first direction adjacent the first region of the first conductivity type, the second region comprising a third BPR disposed in the first direction and configured to provide a third voltage that is different from the first and the second voltages
a diffusion region disposed in a second direction and extending over the second BPR in the second section and the third BPR in the second region; and
a connection between the diffusion region and the second BPR to provide the second voltage to the second region.

12. The memory device of claim 9, wherein the header circuitry further comprises:
a second region of the first conductivity type;
a third section of the first conductivity type disposed in the second region comprising a third BPR disposed in the first direction, the third BPR configured to provide the first voltage;
a fourth section of the first conductivity type disposed in the second region comprising a fourth BPR disposed in the first direction, the fourth BPR configured to provide a third voltage that is different from the first and the second voltages;
a first diffusion region disposed in the first direction over the third and the fourth BPRs;
a second diffusion region disposed in a second direction over the first diffusion region and the third BPR;
a first connection between the second diffusion region and the first BPR;
a third diffusion region disposed in the second direction over the first diffusion region and the fourth BPR;
a second connection between the third diffusion region and the fourth BPR;
a fourth diffusion region disposed in the second direction between the second and the third diffusion regions and over the first diffusion region;
a fifth diffusion region disposed in the second direction between a first side of the second diffusion region and the fourth diffusion region and over the first diffusion region;
a sixth diffusion region disposed in the second direction between a second side of the second diffusion region and over the first diffusion region and the third BPR, the second side opposite the first side;
a first jumper connector disposed in the first direction over the second, the fourth, and the fifth diffusion regions and over a portion of the first diffusion region;
a third connection between the second diffusion region and the first jumper connector;
a fourth connection between the first jumper connector and the fourth diffusion region;
a second jumper connector adjacent the first jumper connector and disposed in the first direction over the second, the third, the fourth, the fifth, and the sixth diffusion regions;
a fifth connection between the sixth diffusion region and the second jumper connector;
a sixth connection between the fifth diffusion region and the second jumper connector; and
a seventh connection between the third diffusion region and the second jumper connector.

13. The memory device of claim 9, wherein the header circuitry further comprises:
a third section of the first conductivity type disposed in the first region comprising a third BPR disposed in the first direction, the third BPR configured to provide the first voltage;
a first diffusion region disposed in the first direction over the first and the second and the third BPRs;
a second diffusion region disposed in a second direction over the first diffusion region and the first BPR;
a first connection between the second diffusion region and the first BPR;
a third diffusion region disposed in the second direction over the first diffusion region and the second BPR;
a second connection between the third diffusion region and the second BPR;
a fourth diffusion region disposed in the second direction over the first diffusion region and the third BPR; and
a third connection between the fourth diffusion region and the first diffusion region third BPR.

14. An electronic device, comprising:
a processing device; and
a memory device operably connected to the processing device, wherein the processing device is operable to control operations of the memory device, the memory device comprising:
a memory array; and
a header circuitry comprising a plurality of switching devices operably connected to the memory array, the header circuitry comprising:
a first region of a first conductivity type;
a first section of the first conductivity type disposed in the first region comprising a first backside power rail (BPR) disposed in a first direction, the first BPR configured to provide a first voltage;
a second section of a second conductivity type disposed in the first region, the second section comprising a second BPR disposed in the first direction, the second BPR configured to provide a second voltage that is different from the first voltage; and
a second region of the second conductivity type disposed in the first direction adjacent the first region of the first conductivity type, the second region comprising a third BPR disposed in the first direction and configured to provide a third voltage that is different from the first and the second voltages.

15. The electronic device of claim 14, wherein:
the first conductivity type is an n-type conductivity; and
the second conductivity type is a p-type conductivity.

16. The electronic device of claim 15, wherein the header circuitry further comprises:
- a diffusion region disposed in a second direction and extending over the second BPR in the second section and the third BPR in the second region; and
- a connection between the diffusion region and the second BPR to provide the second voltage to the second region.

17. The electronic device of claim 15, wherein the header circuitry further comprises:
- a third section of the first conductivity type disposed in the first direction in the first region of the first conductivity type, the third section comprising a fourth BPR disposed in the first direction and configured to provide the first voltage;
- a diffusion region disposed in a second direction and extending over the fourth BPR in the third section; and
- a connection between the diffusion region and the fourth BPR.

18. The electronic device of claim 14, wherein:
the first conductivity type is a p-type conductivity; and
the second conductivity type is an n-type conductivity.

19. The electronic device of claim 18, wherein the header circuitry further comprises:
- a first diffusion region disposed in the first direction over the first and the second BPRs;
- a second diffusion region disposed in a second direction over the first diffusion region and the first BPR;
- a first connection between the second diffusion region and the first BPR;
- a third diffusion region disposed in the second direction over the first diffusion region and the second BPR; and
- a second connection between the third diffusion region and the second BPR.

20. The electronic device of claim 19, further comprising:
- a third section of the first conductivity type disposed in the first region comprising a fourth BPR disposed in the first direction, the fourth BPR operable to provide the first voltage;
- a fourth diffusion region disposed in the second direction over the first diffusion region and the fourth BPR; and
- a third connection between the fourth diffusion region and the fourth BPR.

\* \* \* \* \*

UNITED STATES PATENT AND TRADEMARK OFFICE
CERTIFICATE OF CORRECTION

PATENT NO. : 11,398,257 B2
APPLICATION NO. : 17/085067
DATED : July 26, 2022
INVENTOR(S) : Haruki Mori et al.

It is certified that error appears in the above-identified patent and that said Letters Patent is hereby corrected as shown below:

In the Specification

Column 5, Line 53:
"they" should read --the y--

Column 6, Line 7:
"they" should read --the y--

Column 6, Line 37:
"they" should read --the y--

Column 7, Line 25:
"they" should read --the y--

Column 7, Line 37:
"they" should read --the y--

Column 13, Line 43:
"they" should read --the y--

Column 15, Line 40:
"they" should read --the y--

In the Claims

Column 20, Line 39:
"the first diffusion region" should read --the--

Signed and Sealed this
Eighth Day of November, 2022

Katherine Kelly Vidal
*Director of the United States Patent and Trademark Office*